(12) United States Patent
Seok (10) Patent No.: US 10,446,674 B2
(45) Date of Patent: Oct. 15, 2019

(54) TRENCH IGBT WITH WAVED FLOATING P-WELL ELECTRON INJECTION

(71) Applicant: Littelfuse, Inc., Chicago, IL (US)

(72) Inventor: Kyoung Wook Seok, Milpitas, CA (US)

(73) Assignee: LITTELFUSE, INC., Chicago, IL (US)

( * ) Notice: Subject to any disclaimer, the term of this patent is extended or adjusted under 35 U.S.C. 154(b) by 0 days.

(21) Appl. No.: 15/687,545

(22) Filed: Aug. 28, 2017

(65) Prior Publication Data

US 2017/0358669 A1 Dec. 14, 2017

Related U.S. Application Data

(63) Continuation of application No. 14/983,569, filed on Dec. 30, 2015, now Pat. No. 9,780,202, which is a continuation-in-part of application No. 14/840,322, filed on Aug. 31, 2015, now Pat. No. 9,780,168.

(51) Int. Cl.
*H01L 29/739* (2006.01)
*H01L 21/266* (2006.01)
*H01L 29/06* (2006.01)
*H01L 29/10* (2006.01)
*H01L 29/66* (2006.01)

(52) U.S. Cl.
CPC ........ *H01L 29/7397* (2013.01); *H01L 21/266* (2013.01); *H01L 29/0619* (2013.01); *H01L 29/0696* (2013.01); *H01L 29/1095* (2013.01); *H01L 29/66348* (2013.01)

(58) Field of Classification Search
None
See application file for complete search history.

(56) References Cited

U.S. PATENT DOCUMENTS

| 4,888,627 A | 12/1989 | Pattanayak et al. ......... 357/23.4 |
| 4,912,541 A | 3/1990 | Baliga et al. .................. 357/38 |
| 5,294,816 A | 3/1994 | Shekar et al. ................ 257/163 |
| 5,298,769 A | 3/1994 | Omura et al. ................ 257/138 |

(Continued)

OTHER PUBLICATIONS

J. Baliga, Power Semiconductor Devices, Chapter 9, pp. 543-571 (copyright 1996) (31 pages).

(Continued)

*Primary Examiner* — Walter H Swanson
*Assistant Examiner* — Kien C Ly (57) ABSTRACT

A trench IGBT includes a floating P well and a floating N+ well that extends down into the floating P well. A bottom surface of the floating P well has a novel waved contour so that it has thinner portions and thicker portions. When the IGBT is on, electrons flow from an N+ emitter, vertically through a channel along a trench sidewall, and to an N− type drift layer. Additional electrons flow through the channel but then pass under the trench, through the floating P well to the floating N+ well, and laterally through the floating N+ well. NPN transistors are located at thinner portions of the floating P type well. The NPN transistors inject electrons from the floating N+ type well down into the N− drift layer. The extra electron injection reduces $V_{CE(SAT)}$. The waved contour can be made without adding any masking step to an IGBT manufacturing process.

18 Claims, 8 Drawing Sheets

ELECTRON INJECTION FROM WAVED FLOATING P TYPE WELL REGION

TRENCH IGBT WITH WAVED FLOATING P-WELL ELECTRON INJECTION
(TOP-DOWN VIEW OF THE UPPER SEMICONDUCTOR SURFACE)

(56) References Cited

U.S. PATENT DOCUMENTS

| | | | |
|---|---|---|---|
| 5,317,171 A | 5/1994 | Shekar et al. | 257/138 |
| 5,319,222 A | 6/1994 | Shekar et al. | 257/138 |
| 5,444,273 A | 8/1995 | Ueno | 257/138 |
| 5,498,884 A | 3/1996 | Ajit | 257/132 |
| 5,614,738 A | 3/1997 | Iwamuro | 257/147 |
| 5,757,034 A | 5/1998 | Ajit | 257/133 |
| 5,894,139 A | 4/1999 | Otsuki et al. | 257/139 |
| 5,914,503 A | 6/1999 | Iwamuro et al. | 257/133 |
| 5,936,267 A | 8/1999 | Iwamuro | 257/147 |
| 5,939,736 A | 8/1999 | Takahashi | 257/147 |
| 6,121,089 A | 9/2000 | Zeng et al. | 438/268 |
| 6,664,595 B1 | 12/2003 | Yun et al. | 257/342 |
| 7,211,837 B2 | 5/2007 | Tomomatsu et al. | 257/156 |
| 7,638,839 B2 | 12/2009 | Arai et al. | 257/331 |
| 8,686,513 B1 | 4/2014 | Seok | 257/379 |
| 9,419,118 B1 | 8/2016 | Tsukanov | |
| 9,780,168 B2 | 10/2017 | Seok | |
| 2008/0217649 A1* | 9/2008 | Arai | H01L 29/4236 257/139 |
| 2012/0025262 A1 | 2/2012 | Niimura | 257/139 |
| 2012/0037954 A1* | 2/2012 | Hshieh | H01L 29/0638 257/139 |
| 2012/0139036 A1 | 6/2012 | Niimura et al. | 257/329 |
| 2012/0273884 A1 | 11/2012 | Yedinak et al. | 257/341 |
| 2012/0273916 A1* | 11/2012 | Yedinak | H01L 29/66712 257/471 |
| 2013/0270632 A1* | 10/2013 | Pfirsch | H01L 29/0696 257/331 |
| 2013/0328104 A1 | 12/2013 | Jonishi | 257/139 |
| 2013/0328105 A1* | 12/2013 | Matsuura | H01L 29/0696 257/139 |
| 2014/0054644 A1* | 2/2014 | Hikasa | H01L 29/7395 257/139 |
| 2014/0118055 A1 | 5/2014 | Seok | 327/432 |
| 2014/0124829 A1* | 5/2014 | Andenna | H01L 29/1095 257/139 |
| 2014/0124831 A1 | 5/2014 | Rahimo et al. | 257/139 |
| 2014/0131766 A1 | 5/2014 | Hong | 257/139 |
| 2014/0339599 A1* | 11/2014 | Onozawa | H01L 29/4236 257/139 |
| 2014/0367771 A1 | 12/2014 | Chatty et al. | 257/329 |
| 2015/0144995 A1 | 5/2015 | Takahashi | H01L 29/7397 |
| 2015/0162423 A1* | 6/2015 | Lee | H01L 21/265 257/139 |
| 2015/0349114 A1* | 12/2015 | Miyakoshi | H01L 29/42372 257/330 |
| 2015/0380534 A1 | 12/2015 | Rahimo | H01L 29/7455 |

OTHER PUBLICATIONS

Jun Zeng and C. Frank Wheatley, "An Improved Power MOSFET Using A Novel Split Well Structure," 1999 IEEE, 205-208 (4 pages).

Jun Zeng, C. Frank Wheatley, Rick Stokes, Chris Kocon and Stan Benczkowski, "Optimization of the Body-Diode of Power MOSFETs for High Efficiency Synchronous Rectification," ISPSD May 22-25, 2000, Toulouse, France (4 pages).

\* cited by examiner

TRENCH IGBT WITH WAVED FLOATING
P-WELL ELECTRON INJECTION (TOP-DOWN VIEW OF THE UPPER SEMICONDUCTOR SURFACE)

ELECTRON INJECTION FROM WAVED
FLOATING P TYPE WELL REGION

FIG. 3

EPI OVER SUBSTRATE

FIG. 4A

INITIAL OXIDATION

FIG. 4B

RING MASK, P WELL IMPLANT

FIG. 4C

REMOVE RING MASK,
P WELL ANNEAL

OXIDE DEPOSITION

FIG. 4F

TRENCH MASK, OXIDE ETCH

FIG. 4G

TRENCH MASK REMOVAL,
ETCH TRENCH

FIG. 4H

OXIDE ETCH

FIG. 4I

SACRIFICIAL OXIDATION,
OXIDE ETCH,
GATE OXIDATION

FIG. 4J

GATE POLY DEPOSITION

POLY ETCH BACK

FIG. 4K

FORM N+ MASK, N+ SOURCE IMPLANT

FIG. 4L

REMOVE N+ MASK, ANNEAL

FIG. 4M

OXIDE DEPOSITION

FIG. 4N

CONTACT MASK, ETCH
CONTACTS

FIG. 4O

REMOVE CONTACT MASK,
P+ IMPLANTATION

FIG. 4P

ANNEAL

FIG. 4Q

METAL DEPOSITION,
MASKING, AND ETCHING

FIG. 4R

FIG. 4S
BACKSIDE GRINDING

FIG. 4T
BACKSIDE BORON IMPLANTATION

FIG. 4U
BACKSIDE LASER ANNEALING

FIG. 4V
BACKSIDE METAL DEPOSITION

FIG. 4W
PASSIVATION

US 10,446,674 B2

TRENCH IGBT WITH WAVED FLOATING P-WELL ELECTRON INJECTION

CROSS REFERENCE TO RELATED APPLICATION

This application is a continuation of, and claims priority under 35 U.S.C. § 120 from, nonprovisional U.S. patent application Ser. No. 14/983,569 entitled "Trench IGBT With Waved Floating P-Well Electron Injection," filed on Dec. 30, 2015, now U.S. Pat. No. 9,780,202. Application Ser. No. 14/983,569, in turn, is a continuation-in-part of, and claims the benefit under 35 U.S.C. § 120 from, nonprovisional U.S. patent application Ser. No. 14/840,322, entitled "IGBT With Waved Floating P-Well Electron Injection", filed on Aug. 31, 2015. The subject matter of each of the foregoing documents is incorporated herein by reference.

TECHNICAL FIELD

The described embodiments relate to trench Insulated Gate Bipolar Transistors (IGBTs).

BACKGROUND INFORMATION

In an Insulated Gate Bipolar Transistor (IGBT), it is generally the case that increasing the concentration of charge carriers, both electrons and holes, in the N− type drift layer of the IGBT, and maintaining the proper balance and distribution of holes to electrons in the N− type drift layer, serves to reduce the collector-to-emitter saturation voltage $V_{CE(SAT)}$ of the IGBT. IGBT structures are desired that have high concentrations of electrons and holes in their drift regions during the IGBT on state, but yet turn off fast and do not suffer latchup and other problems. U.S. patent application Ser. No. 14/840,322, entitled "IGBT With Waved Floating P-Well Electron Injection", filed Aug. 31, 2015, by Kyoung Wook Seok sets forth several planar IGBT structures.

SUMMARY

A trench IGBT structure includes a floating P type well region down into an N− type drift layer, and a floating N+ type well region that extends down from an upper semiconductor surface into the floating P type well region. A bottom surface (boundary with the N− type drift layer) of the floating P type well region has a novel waved contour so that the floating P type well region has thinner portions and thicker portions. The thinner portions extend to a depth DP2THIN, where DP2THIN is measured from the upper semiconductor surface. The thicker portions extend to a depth DP2THICK, where DP2THICK is measured from the upper semiconductor surface. In one example, the thinner portions of the floating P type well region are less than half as thick as the thicker portions of the floating P type well region. Where the depth of the floating N+ type well region is DN, the quantity DP2THIN minus DN is less than half the quantity DP2THICK minus DN.

When the trench IGBT is on, electrons flow from an N+ type emitter region, vertically through a conductive channel along a trench sidewall, and to the N− type drift layer. In one novel aspect, some electrons flow through the channel but then pass laterally under the trench, into the floating P type well region, up to the floating N+ type well region, and then laterally through the floating N+ type well region. Local electron-injecting NPN transistors are located at the thinner portions of the floating P type well region. Base current for these local NPN transistors is supplied in the form of hole flow, where the holes pass upward from the N− drift region into the floating P type well region, and then pass into the thinner base portions of the floating P type well region (thereby constituting base currents for the NPN transistors), and then pass up into the floating N+ type well region (at the emitters of the local transistors). These holes then pass laterally in the N+ type well region for a distance toward the trench edge of the floating N+ type well region, but they combine with some of the electrons of the much larger electron flow in the opposite direction. In the IGBT on state, these local NPN transistors turn on and inject electrons from the floating N+ type well region down into the N− type drift layer. The extra electron injection, which occurs in the areas of the thinner portions, serves to reduce $V_{CE(SAT)}$ of the trench IGBT in the IGBT's on state.

In some examples, the waved contour of the bottom boundary of the floating P type well region is made without adding any masking step to a trench IGBT manufacturing process. The same ring mask used to define and to form floating P type rings in an edge termination area of the trench IGBT is also used to define and to form the thinner portions of the floating P type well region. Spacings between features of this ring mask can be adjusted and set so as to set DP2THIN, and to set the shape and width of the thinner portions. In one example, a thinner portion of the floating P type well region has a closed polygonal ring shape when the trench IGBT die structure is considered from the top-down perspective. Multiple such thinner portions in one example form a set of concentric polygonal rings when the trench IGBT die structure is considered from the top-down perspective. In one example, the floating P type well region forms a part of a sidewall of a trench, and the floating P type well region at all locations along this trench extends from the upper semiconductor surface to a depth greater than DP2THIN.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "down", "vertically", "laterally", "lower", "bottom", and "backside" are used herein to describe relative orientations between different parts of the structure being described, and it is to be understood that the overall structure being described can actually be oriented in any way in three-dimensional space. The notations N+, N−, N, P++, P+, and P are only relative, and are to be considered in context, and do not denote any particular dopant concentration range. A region denoted generally in the claims to be "P type", however, is being indicated to be P type doped, and may be lightly doped, moderately doped, or heavily doped with P type dopants. Similarly, a region denoted in the claims to be N type is being indicated to be N type doped, and may be lightly doped, moderately doped, or heavily doped with N type dopants.

Figure 1:
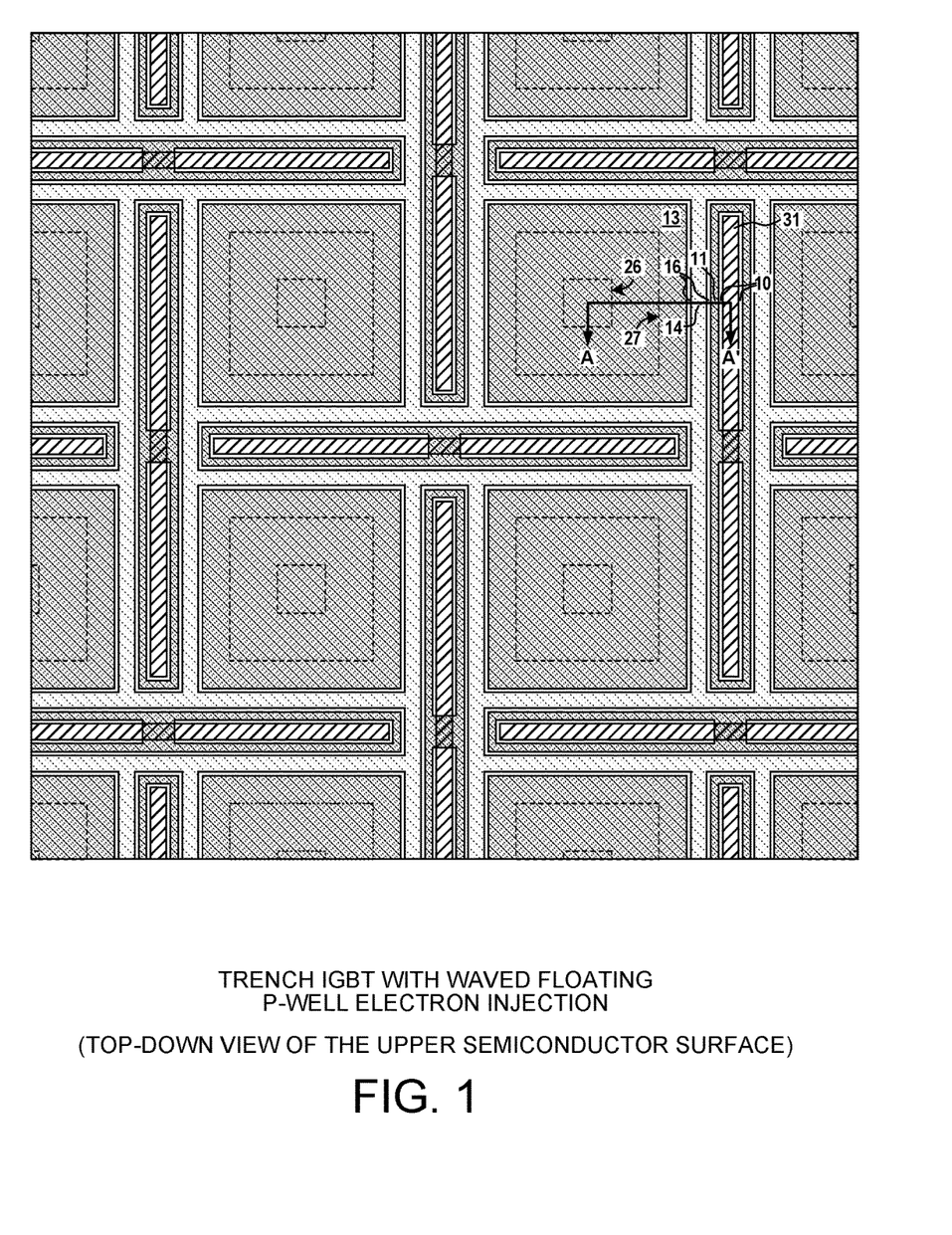
FIG. 1 is a top-down diagram of the semiconductor surface of a trench IGBT die structure in accordance with one novel aspect.

FIG. 1 is a top-down diagram of a square part of a central active area of an IGBT die structure 2 in accordance with one novel aspect. The top-down diagram is of the upper semiconductor surface 8 of the IGBT die structure 2. Overlying layers, such as passivation, metallization layers, and oxide layers, are omitted from FIG. 1 so that the underlying semiconductor structures will not be obscured in the diagram. The central active area has a repeating structure and pattern as illustrated in FIG. 1. Surrounding this repeating structure and pattern in the active area is a peripheral edge termination area (not shown). The peripheral edge termination area includes, among other edge termination structures, multiple concentric floating P type guard rings (not shown). These floating P type guard rings ring around the central active area, and extend along the outer square peripheral edge of the die.

Figure 2:
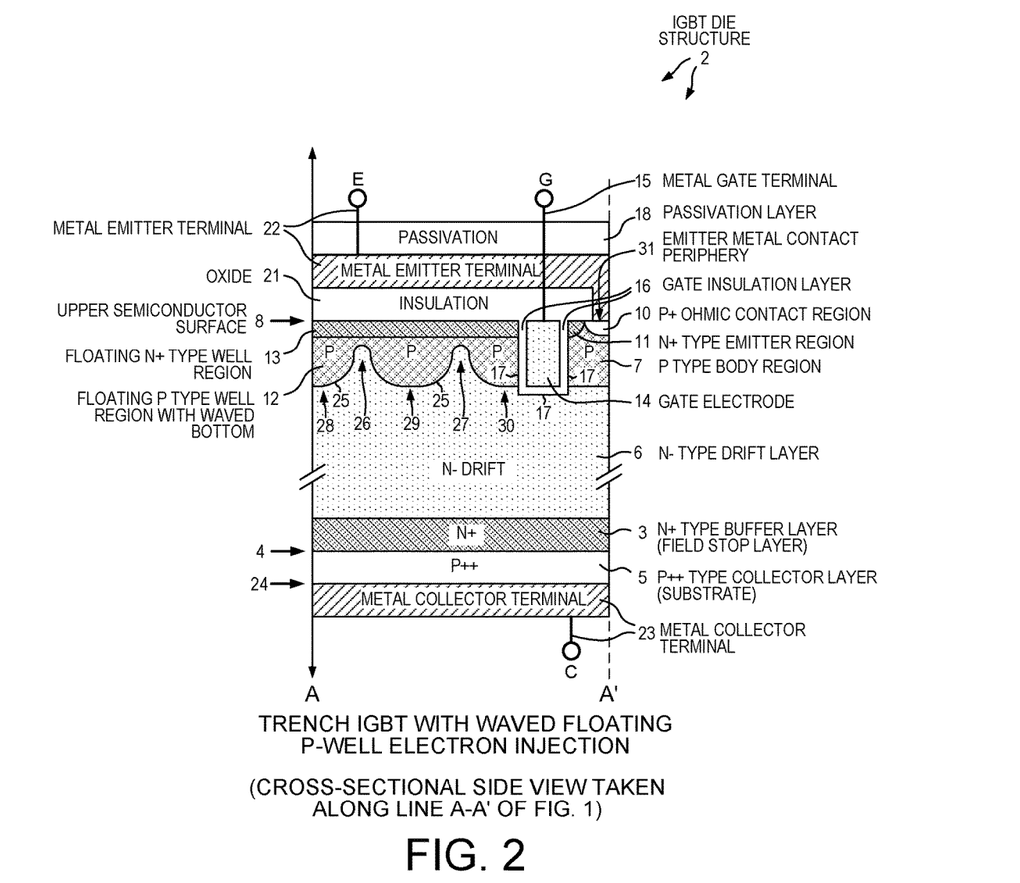
FIG. 2 is a cross-sectional diagram taken along sectional line A-A' of FIG. 1.

FIG. 2 is a cross-sectional diagram taken along sectional line A'-A in the top-down diagram of FIG. 1. The vertical line labeled A at the left of FIG. 1 corresponds to a central location A in the structure of FIG. 2.

The trench IGBT die structure 2 includes an N+ type buffer layer (also called a "field stop" layer) 3 that is disposed over the top major surface 4 of a P++ type semiconductor substrate layer 5. An N− drift layer 6 is in turn disposed over the N+ type buffer layer 3. A P type body region 7 is formed to extend down into the N− type drift layer 6. The P type body region 7 has a relatively lighter doped P type portion and a relatively heavily doped P+ type portion 10. An N+ type emitter region 11 is formed to extend from a substantially planar upper semiconductor surface 8 down into the P type body region 7.

In addition, a floating P type well layer or region 12 is formed to extend down into the N− drift layer 6. The floating P type well region 12 is laterally separated from the P type body region 7 by a trench 17. As seen in the top-down diagram of FIG. 1, this trench actually extends all the way around the floating P type well region 12. A floating N+ type well region or layer 13 is formed to extend down into the floating P type well region 12 from the upper semiconductor surface 8 as illustrated. The trench 17 extends downward from the upper semiconductor surface 8 as illustrated. The square area (as seen from the top-down diagram of FIG. 1) of the two floating regions 12 and 13 may also be referred to as a "dummy" cell in that it looks somewhat like another cell of the multi-cell structure, but it does not have an N+ type emitter region like region 11. Even though the floating N+ type well region 13 in this particular example is disposed between the top of the floating P type well region 12 and the upper semiconductor surface 8, the floating P type well region 12 is said to extend into the N− type drift layer 6 "from" the surface 8 to indicate a direction of origination consistent with the structure illustrated in FIG. 2.

A thin gate oxide layer 16 is formed on the sidewall surfaces and on the bottom surface of the trench. A gate electrode 14 of N+ type polysilicon fills the remainder of the trench as illustrated, and as is conventional in trench IGBT manufacture. The N+ type polysilicon of the gate electrode may have an N type dopant concentration in a range of from $1 \times 10^{19}$ atoms/cm$^3$ to $1 \times 10^{21}$ atoms/cm$^3$. The trench IGBT die structure 2 of FIG. 1 further includes an oxide layer 21. A first metal electrode and terminal 22 (the emitter terminal) is disposed over the oxide 21 and is coupled both to the N+ type emitter region 11 and to the P type body region 7 via the P+ ohmic contact region 10. The P+ type ohmic contact region may have a P type dopant concentration of about $1 \times 10^{19}$ atoms/cm$^3$. The area shown in cross-hatching in FIG. 1 and identified by reference numeral 31 is this metal-to-semiconductor contact region. A second metal electrode and terminal 15 (the gate terminal) has a contact portion at the top of the IGBT die structure and is coupled to the polysilicon gate electrode 14. The second metal electrode and terminal 15 is not shown in the cross-section of FIG. 2 because the contacts between the second metal electrode 15 and the polysilicon gate electrode 14 is outside the active area. The gate terminal 15 is therefore represented in FIG. 2 by a terminal symbol. A third metal electrode and terminal 23 (the collector terminal) is formed on the bottom major surface 24 of the P++ type substrate layer 5. A passivation layer 18 covers the top of the IGBT die structure, but for exposed contact areas down to the emitter terminal metal and down to the gate terminal metal.

The floating P type well region 12 has a waved bottom interface 25 with the underlying N− type drift layer 6. Due to the waved form of this interface 25, the floating P type well region has thinner portions 26 and 27 as well as thicker portions 28, 29 and 30. The bottom of each the thinner portions 26 and 27 of the floating P type well region 12 is at a depth DPTHIN (measured from the upper semiconductor surface 8). The bottom of each of the thicker portions 28, 29 and 30 of the floating P type well region 12 has a depth DPTHICK (measured from the upper semiconductor surface 8). The P type body region 7 has a depth DP1 (measured from the upper semiconductor surface 8). The trench 17 extends downward from the upper semiconductor surface 8 to a depth DT. The floating N+ type well region 13 and the N+ type emitter region 11 extend downward from the upper semiconductor surface 8 to a depth DN. The dimensions DN, DP2THIN, DP2THICK, and DP1 are illustrated on FIG. 3, along with dimensional relationships. In one example, each of the thinner portions of the floating P type well region is less than half as thick as the thicker portions of the floating P type well region. Accordingly, the quantity DP2THIN minus DN is less than half of the quantity DP2THICK minus DN. In one specific example, DN is 0.3 microns, DP2THIN is 0.5 microns, DP2THICK is 1.7 microns, DP1 is 1.7 microns, and DT is 2.0 microns. The locations of the thinner portions 26 and 27 are indicated in the top-down diagram of FIG. 1 by the two concentric squares labeled 26 and 27. The first thinner portion 26 is a smaller square ring as illustrated in FIG. 1. The second thinner portion 27 is a larger square ring that rings around and surrounds the smaller ring.

At the location of a thinner portion, a local electron-injecting NPN bipolar transistor structure is formed. For example, in the case of thinner portion 26, a local portion of the floating N+ type well 13 is the emitter, the thinner portion 26 of the floating P type well region 12 is the base, and an amount of N− type semiconductor material of the N− type drift region 6 immediately below thinner portion 26 is the collector. When these local electron-injecting NPN bipolar transistors turn on, they can inject electrons downward from the N+ type emitter region 13 into the N− type drift region 6 as described in more detail below.

The trench IGBT device is turned on by placing an appropriate positive voltage on the gate electrode 14, thereby establishing a conductive channel along the vertical sidewall trench between the N+ type emitter region 11 and the N− type drift layer 6. In conventional IGBT fashion, electrons flow from the N+ type emitter region 11, vertically downward through this channel through the P type body region 7, and to the N− type drift layer 6, and from there the electrons continue to pass vertically downward deeper into the N− type drift layer 6. This electron flow is illustrated by heavy arrows 32 and 33 in FIG. 3. In addition, in conventional IGBT fashion, the PN junction between the P+ type collector layer 5 and the N+ type buffer layer 3 injects holes upward, and the holes pass up into the N− type drift layer 6. A high concentration of electrons and holes in the N− drift layer 6 forms. This high concentration of electrons and holes is referred to as a plasma or as an electron/hole gas. Overall, a collector-to-emitter current in the on state of the IGBT flows from the collector electrode 23, vertically up through the device, and to the emitter electrode 22.

Figure 3:
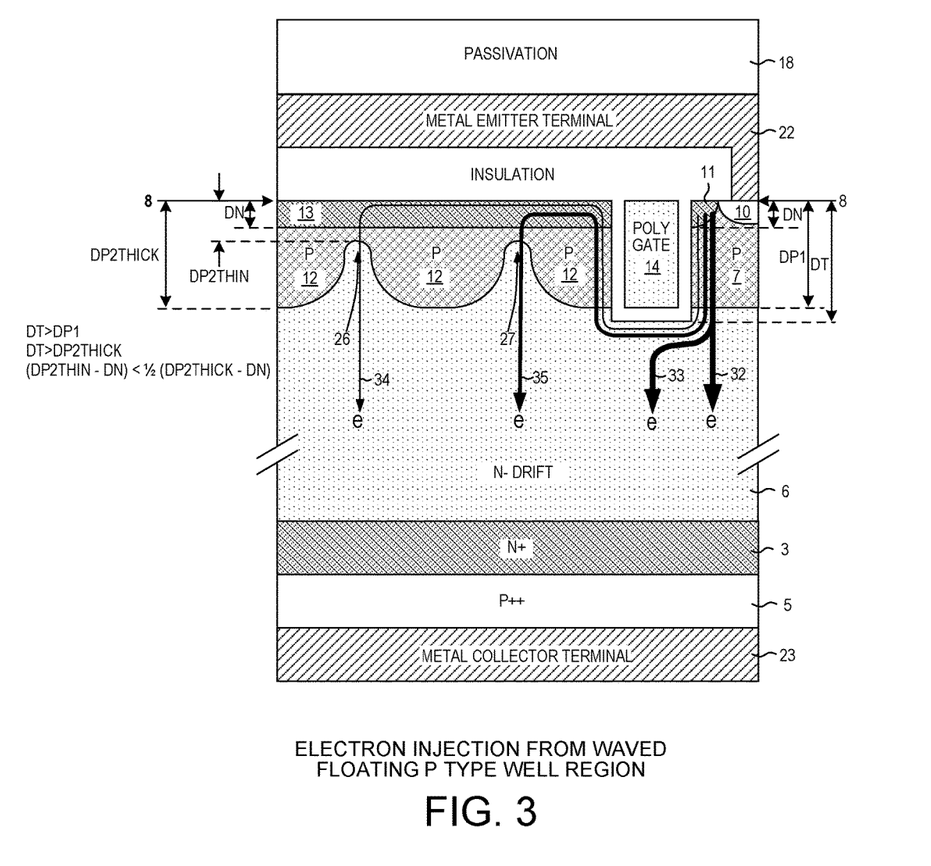
FIG. 3 is a cross-sectional diagram taken along sectional line A-A' of FIG. 1, where the diagram sets forth dimensions, dimensional relationships, and illustrates electron injection from local electron-injector NPN bipolar transistors.

In addition to this conventional current flow in the IGBT on state, electrons also flow as indicated by arrows 34 and 35 in FIG. 3. Electrons flow from the N+ type emitter region 11, vertically downward through the conductive channel, then laterally and horizontally under the bottom of the trench 17, and then through the floating P type well region 12, and to the floating N+ type well region 13. These electrons flow horizontally through the N+ type well region, and then are injected downward by local NPN bipolar transistors. There is a first such local NPN bipolar transistor formed in the area of thinner portion 26. The emitter of this first local NPN bipolar transistor is a part of the floating N+ type well region immediately above the thinner portion 26. The base of this first local NPN bipolar transistor is the thinner portion 26 of the floating P type well region. The collector of this first local NPN bipolar transistor is the N− type material of the N− type drift layer 6 immediately beneath the thinner portion 26. Base current for this first local NPN transistor is supplied in the form of hole flow, where the holes pass upward from the N− drift region 6 into thicker portions of the floating P type well region, and then pass into the thinner base portion 26 of the floating P type well region 12 (thereby constituting a base current flowing into the base portion of the first local NPN transistor), and then pass up into the floating N+ type well region (that is the emitter of the first local NPN transistor). These holes then pass laterally in the floating N+ type well region for a distance toward the trench edge of the N+ type well region, but they combine with some of the electrons of the much larger electron flow in the opposite direction. In the IGBT on state, this first local NPN bipolar transistor turns on and injects electrons from the floating N+ type well region 13 vertically downward as indicated by arrow 34.

In addition, there is a second such local NPN bipolar transistor formed in the area of thinner portion 27. The emitter of the second local NPN bipolar transistor is a part of the floating N+ type well region 13 immediately above the thinner portion 27. The base of the second local NPN bipolar transistor is the thinner portion 27 of the floating P type well region. The collector of the second local NPN bipolar transistor is the N− type material of the N− type drift layer 6 immediately beneath the thinner portion 27. Base current for this second local NPN transistor is supplied in the form of hole flow, where the holes pass upward from the N− drift region 6 into thicker portions of the floating P type well region, and then pass into the thinner base portion 27 of the floating P type well region 12 (thereby constituting a base current flowing into the base portion of the second local NPN transistor), and then pass up into the floating N+ type well region (that is the emitter of the second local NPN transistor). These holes then pass laterally in the floating N+ type well region for a distance toward the trench edge of the N+ type well region, but they combine with some of the electrons of the much larger electron flow in the opposite direction. In the IGBT on state, this second local NPN bipolar transistor turns on and injects electrons from the floating N+ type well region 13 vertically downward as indicated by arrow 35. The extra electron injection afforded by the floating well structures reduces $V_{CE(SAT)}$. The precise nature of carrier flow may not be as simple as described above, but the overall electron-injecting phenomenon and effect has been verified by simulation using the ISE-TCAD device simulator available from Synopsis, Inc., 690 East Middlefield Road, Mountain View, Calif. 94043.

In the IGBT off state, the voltage on the gate electrode 14 is such that there is no conductive channel through the P type body region 7 along the vertical sidewall edge of the trench 17. Electrons therefore cannot pass from the N+ type emitter region vertically down through any channel to the N− drift layer 6. Holes are therefore not injected upward across the PN junction between layers 5 and 3 in bipolar IGBT action. Because there is no electron flow from the N+ type emitter region vertically down through any channel, current flow through the floating N and P type well regions that occurs in the IGBT on state to inject additional electrons into the N− drift layer does not occur in the IGBT off state. Accordingly, there is no current flow between the IGBT collector terminal and the IGBT emitter terminal, and the IGBT device is off.

In the off state of the IGBT structure, there may be a high reverse voltage present across the device between the collector and the emitter. The floating P type well region 12 is made thicker where it is adjacent the trench 17. The depth DP2THICK of the floating P type well region 12 at this location adjacent the trench is substantially the same as the depth DP1 of the P type body region 7 on the other side of trench 17. Due to the floating P type well region 12 and the P type body region 7 being deep in these areas adjacent to the trench, the curvature of the electric field under high reverse voltages in the IGBT off state is relaxed. The less-sharp curvature of the electric field under the trench and at the bottom corners of the trench 17 serves to increase the reverse voltage at which the IGBT suffers reverse breakdown.

Figure 4A:
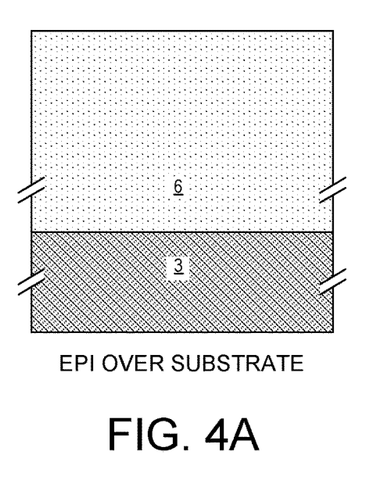
FIG. 4A is a cross-sectional diagram that illustrates a first step in a method of manufacturing the IGBT die structure of FIG. 1.
Figure 4B:
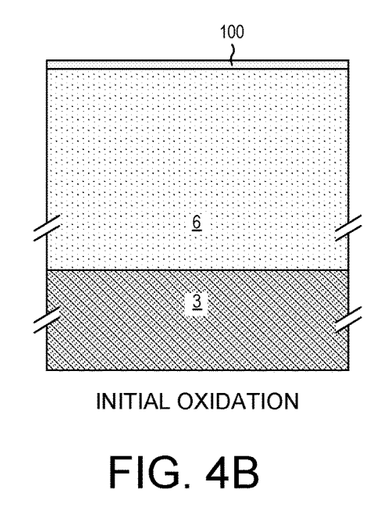
FIG. 4B is a cross-sectional diagram that illustrates a second step in a method of manufacturing the IGBT die structure of FIG. 1.
Figure 4C:
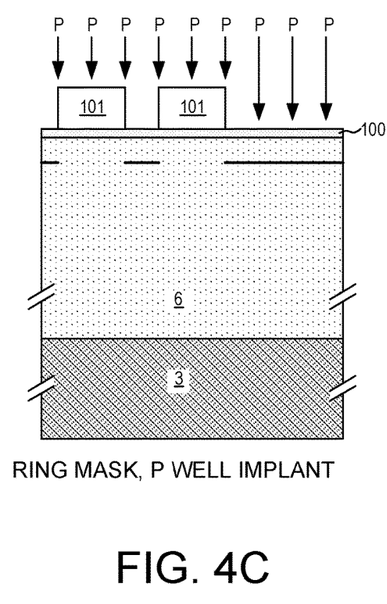
FIG. 4C is a cross-sectional diagram that illustrates a third step in a method of manufacturing the IGBT die structure of FIG. 1.
Figure 4D:
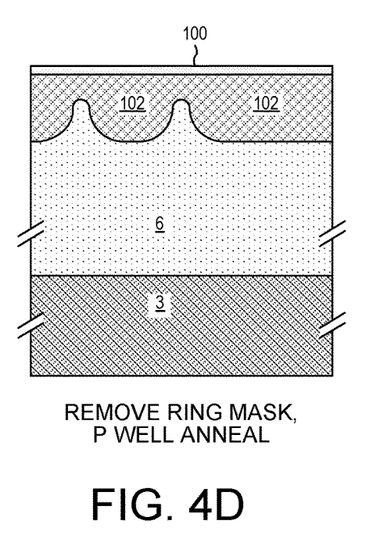
FIG. 4D is a cross-sectional diagram that illustrates a fourth step in a method of manufacturing the IGBT die structure of FIG. 1.
Figures 4E, 4F:
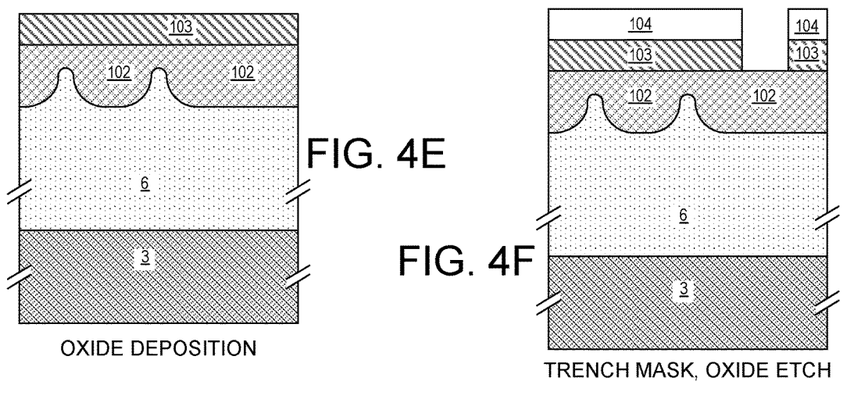
FIG. 4E is a cross-sectional diagram that illustrates a fifth step in a method of manufacturing the IGBT die structure of FIG. 1.
FIG. 4F is a cross-sectional diagram that illustrates a sixth step in a method of manufacturing the IGBT die structure of FIG. 1.
Figures 4G, 4H:
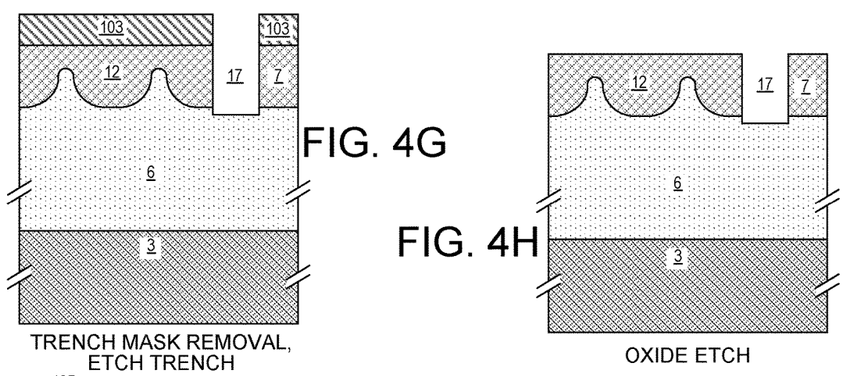
FIG. 4G is a cross-sectional diagram that illustrates a seventh step in a method of manufacturing the IGBT die structure of FIG. 1.
FIG. 4H is a cross-sectional diagram that illustrates an eighth step in a method of manufacturing the IGBT die structure of FIG. 1.
Figure 4I:
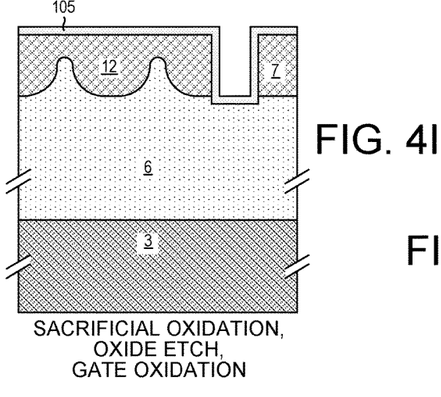
FIG. 4I is a cross-sectional diagram that illustrates a ninth step in a method of manufacturing the IGBT die structure of FIG. 1.
Figure 4J:
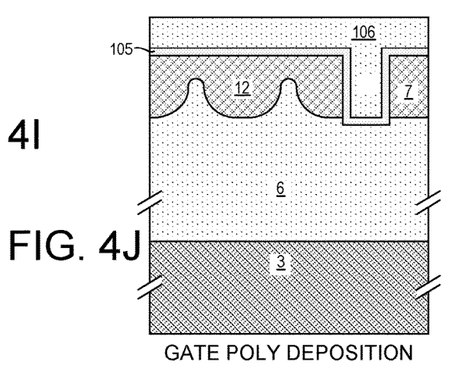
FIG. 4J is a cross-sectional diagram that illustrates a tenth step in a method of manufacturing the IGBT die structure of FIG. 1.
Figure 4K:
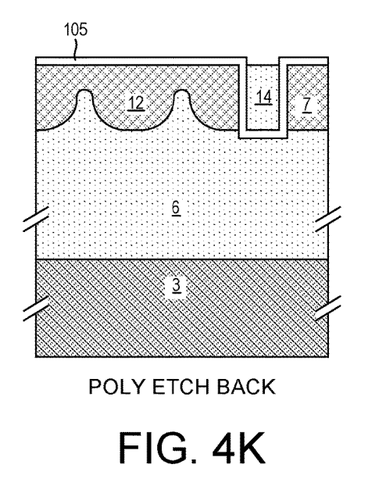
FIG. 4K is a cross-sectional diagram that illustrates an eleventh step in a method of manufacturing the IGBT die structure of FIG. 1.
Figure 4L:
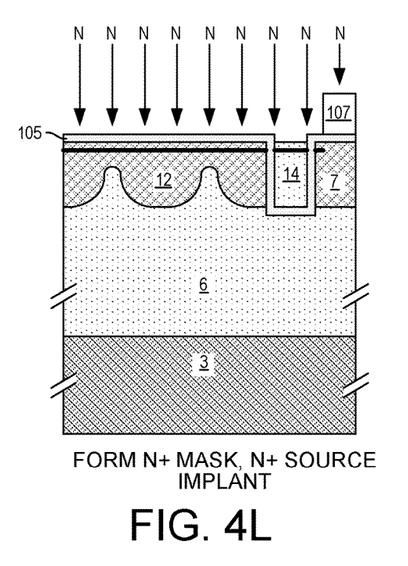
FIG. 4L is a cross-sectional diagram that illustrates a twelfth step in a method of manufacturing the IGBT die structure of FIG. 1.
Figure 4M:
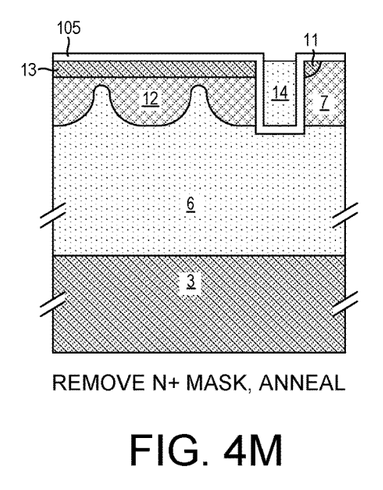
FIG. 4M is a cross-sectional diagram that illustrates a thirteenth step in a method of manufacturing the IGBT die structure of FIG. 1.
Figure 4N:
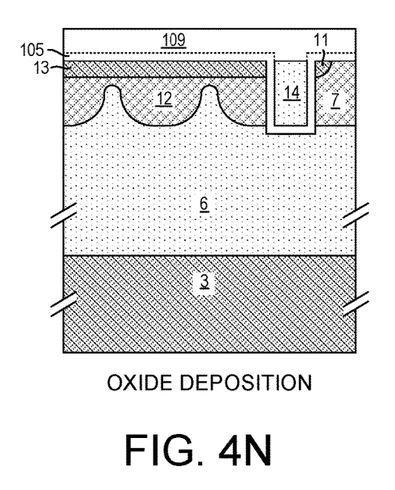
FIG. 4N is a cross-sectional diagram that illustrates a fourteenth step in a method of manufacturing the IGBT die structure of FIG. 1.
Figures 4O, 4P:
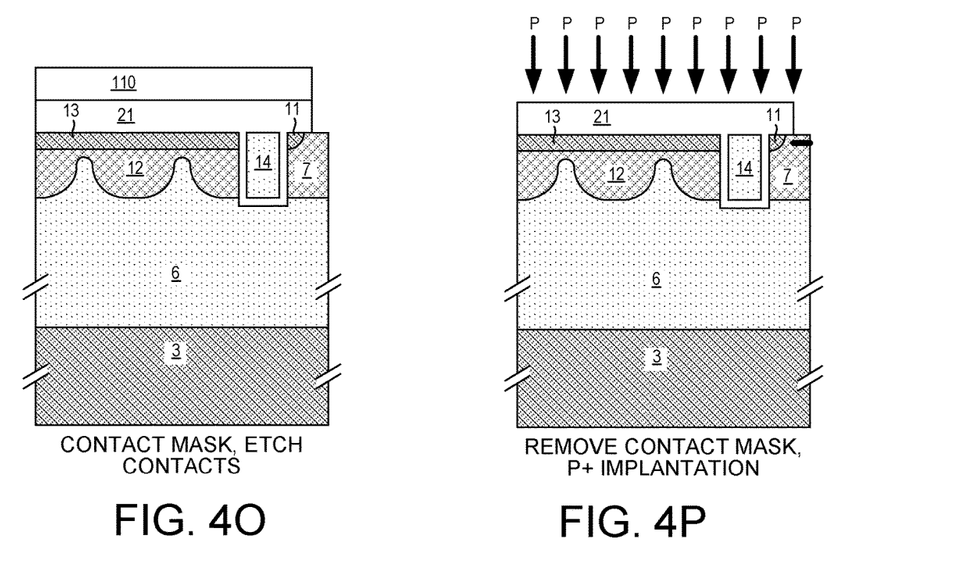
FIG. 4O is a cross-sectional diagram that illustrates a fifteenth step in a method of manufacturing the IGBT die structure of FIG. 1.
FIG. 4P is a cross-sectional diagram that illustrates a sixteenth step in a method of manufacturing the IGBT die structure of FIG. 1.
Figure 4Q:
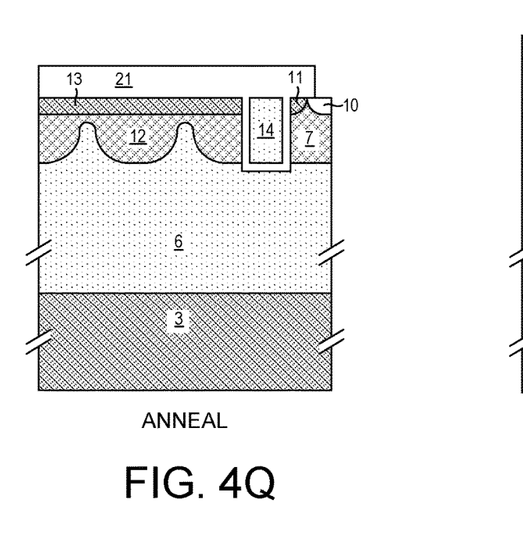
FIG. 4Q is a cross-sectional diagram that illustrates a seventeenth step in a method of manufacturing the IGBT die structure of FIG. 1.
Figure 4R:
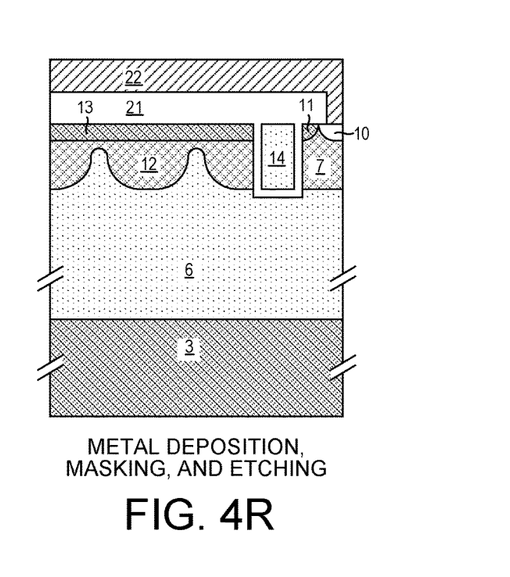
FIG. 4R is a cross-sectional diagram that illustrates an eighteenth step in a method of manufacturing the IGBT die structure of FIG. 1.
Figures 4S, 4T, 4U, 4V, 4W:
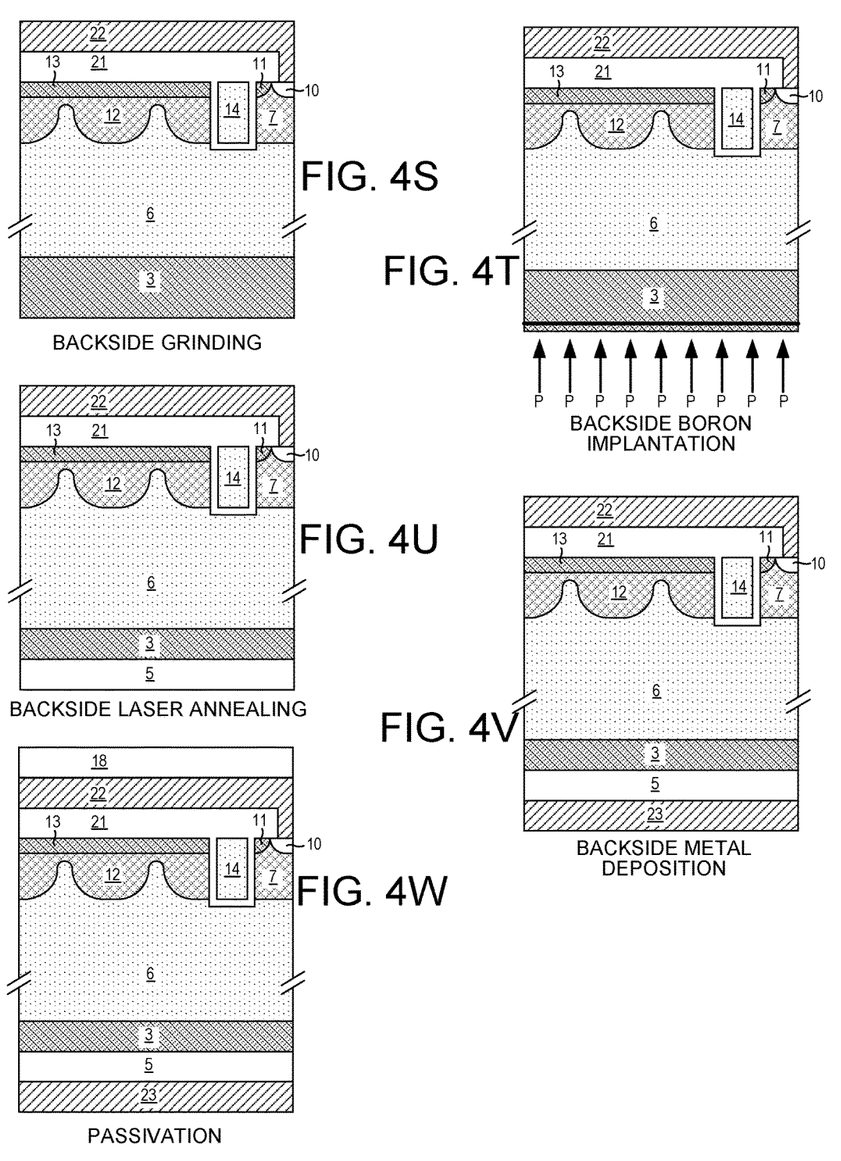
FIG. 4S is a cross-sectional diagram that illustrates a nineteenth step in a method of manufacturing the IGBT die structure of FIG. 1.
FIG. 4T is a cross-sectional diagram that illustrates a twentieth step in a method of manufacturing the IGBT die structure of FIG. 1.
FIG. 4U is a cross-sectional diagram that illustrates a twenty-first step in a method of manufacturing the IGBT die structure of FIG. 1.
FIG. 4V is a cross-sectional diagram that illustrates a twenty-second step in a method of manufacturing the IGBT die structure of FIG. 1.
FIG. 4W is a cross-sectional diagram that illustrates a twenty-third step in a method of manufacturing the IGBT die structure of FIG. 1.

FIGS. 4A through 4V are sets of diagrams that illustrate a method of manufacturing the IGBT die structure of FIG. 1. An N− type drift layer 6 is disposed over the top major surface of an N+ type buffer layer 3. In one example, the N+ type buffer layer 3 is a layer of semiconductor substrate of monocrystalline wafer material and the N− type drift layer 6 is formed on the top major surface 4 by epitaxial deposition. This structure, as shown in FIG. 4A, is the starting material for the process. Next, an oxide layer 100 is formed on the upper surface of the wafer as shown in FIG. 4B. Next, a ring mask 101 is formed. The separations between the features of the ring mask 101 determines the spacing between the thicker portions of the floating P type well region to be formed, and also determines how shallow the thinner portions of the floating P type well region will be. An extra mask is not necessary to form the waved bottom boundary of the floating P type well region because the ring mask 101 of FIG. 4C is used in the IGBT manufacturing process to form the floating P type rings in the edge termination area of the die. In accordance with one novel aspect, addition features of this ring mask are provided in the active area so as to define and to form the thinner portions of the floating P type well region as shown in FIG. 4C. After implantation using this ring mask 101, the ring mask is removed as shown in FIG. 4D, and the P type dopants are diffused downward in an annealing step as illustrated in FIG. 4D to form P type region 102. Next, a thicker oxide layer 103 is deposited as shown in FIG. 4E. A trench mask 104 is formed, and the oxide 103 is etched as illustrated in FIG. 4F. The trench mask 104 is then removed, and the patterned thick oxide 103 is used as a mask to etch trench 17 as illustrated in FIG. 4G. This forms the floating P type well region 12 and the P type body region 7. The patterned oxide layer 103 is then removed as illustrated in FIG. 4H. Next, a thin oxide layer 105 is formed as illustrated in FIG. 4I. Polysilicon 106 is then deposited everywhere, including in the trenches, as illustrated in FIG. 4J. The polysilicon layer 106 is then etched away, such that polysilicon electrode 14 is left filling the trench, as shown in FIG. 4K. An N+ mask 107 is formed, and N type dopants are implanted as shown in FIG. 4L. The N+ mask 107 is then removed, and the N type dopants are diffused in an anneal step as illustrated in FIG. 4M. This forms the floating N+ type well region 13 as well as the N+ type emitter region 11 as shown in FIG. 4M. The upper surface of the die is then planarized, and a layer of oxide 109 is deposited, as illustrated in FIG. 4N. A contact mask 110 is then formed, and the contact mask is used in a contact etching step to form contacts down to the semiconductor surface as illustrated in FIG. 4O. This patterns oxide layer 106 into oxide layer 21. The contact mask 110 is then removed and P type dopants are implanted as shown in FIG. 4P. The P type dopants are then diffused in an anneal step to form contact region 10 as illustrated in FIG. 4Q. Metal is deposited, masked, and patterned to form the emitter metal electrode as illustrated in FIG. 4R. Backside grinding is then performed to thin the N+ type substrate layer 3 as illustrated in FIG. 4S. P type dopants are implanted from the backside into the thinned N+ type substrate layer 3 as illustrated in FIG. 4T. The P type dopants are diffused in a backside laser annealing step as illustrated in FIG. 4U to form P++ type collector layer 5. N+ type silicon of the prior N+ substrate becomes the N+ type buffer layer of the IGBT. Metal is then deposited on the backside of the wafer to form the collector terminal 23 as illustrated in FIG. 4V. The upper surface of the wafer is then covered with a passivation layer 18 as illustrated in FIG. 4W. The resulting wafer is then singulated into individual IGBT dice. The individual IGBT dice are packaged and tested.

Although certain specific embodiments are described above for instructional purposes, the teachings of this patent document have general applicability and are not limited to the specific embodiments described above. The floating N+ type well region may have various different shapes and thicknesses in various embodiments, and does not need to entirely separate the floating P type well region from the upper semiconductor surface in all embodiments. The floating N+ type well region can have more than one thickness. The floating N+ type well region need not, in all embodiments, form any part of a sidewall of the trench. In the same IGBT dummy cell, some of the local electron-injecting NPN transistors can have thicker bases whereas others of the local electron-injecting NPN transistors can have thinner bases. The floating P type well region and the floating N type well region are designed together so that the resulting thicknesses of the bases of the local electron-injecting transistors are proper for obtaining and maintaining the desired charge balance between electrons and holes across the lateral dimension of the IGBT device when the IGBT is in the on state. The N type dopant concentration immediately beneath the trench in the N− type drift layer may be increased (for example, by dopant implantation through the bottom of the trench) in order to increase electron flow laterally under the trench, if such increased electron flow is desired. Where the P type body regions of the device are formed to have areas of higher P type concentration, the same processing steps used to form those areas can also be used to form areas of higher P type concentration in the floating P type well regions. For additional detail, teachings, structures and methods, see: U.S. patent application Ser. No. 14/840,322, entitled "IGBT With Waved Floating P-Well Electron Injection", filed on Aug. 31, 2015, by Kyoung Wook Seok (the entire subject matter of which is incorporated herein by reference). Accordingly, various modifications, adaptations, and combinations of various features of the described embodiments can be practiced without departing from the scope of the invention as set forth in the claims.

What is claimed is:

1. A method of manufacturing a trench Insulated Gate Bipolar Transistor (IGBT) die structure, wherein the trench IGBT die structure has a substantially planar upper semiconductor surface, the method comprising:
   forming a floating P type well region that extends into an N− type drift layer, wherein the floating P type well region has a thinner portion disposed between two of a plurality of thicker portions, wherein the thinner portion of the floating P type well region extends to a depth DP2THIN measured from the substantially planar upper semiconductor surface, wherein the thicker portions of the floating P type well region extend to a depth DP2THICK measured from the substantially planar upper semiconductor surface, wherein DP2THIN is smaller than DP2THICK, wherein the floating P type well region has a closed polygonal outer periphery when the trench IGBT die structure is considered from a top-down perspective, and wherein the floating P type well region at a location along its polygonal outer periphery defines a sidewall of a trench and extends from the substantially planar upper semiconductor surface to the depth DP2THICK, the trench completely surrounding the floating P type well region, wherein the thinner portion of the floating P type well has a polygonal shape when the trench IGBT die structure is considered from the top-down perspective.

2. The method of manufacturing of claim 1, wherein the thinner portion of the floating P type well region is less than half as thick as the thicker portions of the floating P type well region, the method further comprising:
   forming a floating N+ type well region that extends into the floating P type well region from the substantially planar upper semiconductor surface, wherein the floating P type well region does not reach the substantially planar upper semiconductor surface but rather the floating N+ type well region is disposed between the floating P type well region and the substantially planar upper semiconductor surface.

3. The method of manufacturing of claim 2, further comprising:
   using a mask to define a floating P type ring in an edge termination area of the trench IGBT die structure, wherein the mask is also used to define the thinner portion of the floating P type well region.

4. The method of manufacturing of claim 1, further comprising:
   forming the trench between the floating P type well region and a P type body region, wherein the floating P type well region is formed such that in an IGBT on state at least some electrons are injected from the floating P type well region down into the N− type drift layer at locations none of which is disposed under the trench and none of which is disposed under the P type body region.

5. The method of manufacturing of claim 1, further comprising:
   forming a floating N+ type well region that extends into the floating P type well region from the substantially planar upper semiconductor surface, wherein the floating N+ type well region extends over the thinner portion.

6. The method of manufacturing of claim 1, wherein the quantity DP2THIN is less than half the quantity DP2THICK.

7. A method of manufacturing an Insulated Gate Bipolar Transistor (IGBT) die structure, the method comprising:
   forming a floating P type well region that extends into an N− type drift layer and that is laterally separated from a P type body region, wherein the N− type drift layer is disposed over a P type collector layer, wherein the P type body region extends into the N− type drift layer, wherein the floating P type well region and has at least one thinner portion disposed between two of a plurality of thicker portions, wherein the thinner portion of the floating P type well region extends to a depth DP2THIN measured from a substantially planar upper semiconductor surface, wherein the thicker portions of the floating P type well region extend to a depth DP2THICK measured from the substantially planar upper semiconductor surface, wherein DP2THIN is smaller than DP2THICK, wherein the floating P type well region has a closed polygonal outer periphery when the trench IGBT die structure is considered from a top-down perspective, and wherein the floating P type well region at a location along its polygonal outer periphery defines a sidewall of a trench and extends from the substantially planar upper semiconductor surface to the depth DP2THICK, the trench completely surrounding the floating P type well region;
   forming a trench gate electrode disposed in the trench, wherein the trench gate electrode is disposed at least in part between the P type body region on one side of the trench and the floating P type well region on an opposite side of the trench; and
   forming a floating N+ type well region that extends into the floating P type well region from a substantially planar upper semiconductor surface, wherein the floating P type well region is separated from the substantially planar upper semiconductor surface by the floating N+ type well region, and wherein the floating N+ type well region extends laterally over the at least one thinner portion, wherein the trench extends from the substantially planar upper semiconductor surface to a depth DT, wherein the P type body region extends to a depth DP1 measured from the substantially planar upper semiconductor surface, wherein the thicker portions of the floating P type well region extend to a depth DP2THICK measured from the substantially planar upper semiconductor surface, wherein DT is greater than DP1, and wherein DT is greater than DP2THICK, wherein the floating N+ type well region has a polygonal outer periphery when the IGBT die structure is considered from a top-down perspective, and wherein the trench extends around the outer periphery of the floating N+ type well region and the floating P type well region such that it surrounds the floating N+ type well region and the floating P type well region when the IGBT die structure is considered from the top-down perspective.

8. The method of manufacturing of claim 7, further comprising:
forming an N+ type emitter region that extends into the P type body region from the substantially planar upper semiconductor surface.

9. The method of manufacturing of claim 7, further comprising:
using a mask to define a floating P type ring in an edge termination area of the IGBT die structure, wherein the mask is also used to define the at least one thinner portion of the floating P type well region.

10. The method of manufacturing of claim 7, wherein an N+ type buffer layer disposed between the P type collector layer and the N− type drift layer.

11. The method of manufacturing of claim 7, wherein the at least one thinner portion of the floating P type well region is less than half as thick as each of the thicker portions of the floating P type well region.

12. The method of manufacturing of claim 11, wherein the at least one thinner portion of the floating P type well region has a substantially polygonal shape when the IGBT die structure is considered from a top-down perspective.

13. The method of manufacturing of claim 11, wherein a second thinner portion of the floating P type well region has a substantially polygonal shape when the IGBT die structure is considered from the top-down perspective, and wherein the second thinner portion loops around the at least one thinner portion such that the at least one thinner portion and the second thinner portion are concentric polygons when considered from the top-down perspective of the IGBT die structure.

14. The method of manufacturing of claim 7, wherein the floating P type well region at a location along the trench extends to the depth DP2THICK.

15. The method of manufacturing of claim 7, wherein the polygonal outer periphery of the floating P type well region has a shape taken from the group consisting of: an octagon, a square with rounded corners, a rectangle, a rectangle with rounded corners, and a rectangular strip.

16. The method of manufacturing of claim 7, further comprising:
forming an N+ type emitter region that extends into the P type body region from the substantially planar upper semiconductor surface, wherein the N+ type emitter region forms a sidewall of the trench.

17. A method of manufacturing a trench Insulated Gate Bipolar Transistor (IGBT) die structure, wherein the trench IGBT die structure has a substantially planar upper semiconductor surface, the method comprising:
forming a floating P type well region that extends into an N− type drift layer, wherein the floating P type well region has a thinner portion disposed between two of a plurality of thicker portions, wherein the thinner portion of the floating P type well region extends to a depth DP2THIN measured from the substantially planar upper semiconductor surface, wherein the thicker portions of the floating P type well region extend to a depth DP2THICK measured from the substantially planar upper semiconductor surface, wherein DP2THIN is smaller than DP2THICK, wherein the floating P type well region has a closed polygonal outer periphery when the trench IGBT die structure is considered from a top-down perspective, and wherein the floating P type well region at all locations along its polygonal outer periphery defines a sidewall of a trench and extends from the substantially planar upper semiconductor surface to the depth DP2THICK, the trench completely surrounding the floating P type well region, wherein the thinner portion of the floating P type well region is less than half as thick as the thicker portions of the floating P type well region, the method further comprising:
forming a floating N+ type well region that extends into the floating P type well region from the substantially planar upper semiconductor surface, wherein the floating P type well region does not reach the substantially planar upper semiconductor surface but rather the floating N+ type well region is disposed between the floating P type well region and the substantially planar upper semiconductor surface.

18. The method of manufacturing of claim 17, further comprising:
using a mask to define a floating P type ring in an edge termination area of the trench IGBT die structure, wherein the mask is also used to define the thinner portion of the floating P type well region.

\* \* \* \* \*